United States Patent
Yamamoto et al.

(10) Patent No.: US 10,782,317 B2
(45) Date of Patent: Sep. 22, 2020

(54) CONTACT PROBE

(71) Applicant: NIDEC READ CORPORATION, Kyoto (JP)

(72) Inventors: Masami Yamamoto, Kyoto (JP); Norihiro Ota, Kyoto (JP); Shigeki Sakai, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 73 days.

(21) Appl. No.: 15/989,271

(22) Filed: May 25, 2018

(65) Prior Publication Data

US 2018/0340960 A1     Nov. 29, 2018

(30) Foreign Application Priority Data

May 25, 2017 (JP) ................. 2017-104033

(51) Int. Cl.
   *G01R 1/067*   (2006.01)
   *C25D 5/48*    (2006.01)
   (Continued)

(52) U.S. Cl.
   CPC ......... *G01R 1/06761* (2013.01); *C25D 1/04* (2013.01); *C25D 3/12* (2013.01); *C25D 5/12* (2013.01);
   (Continued)

(58) Field of Classification Search
   CPC .......... H01L 2224/13099; H01L 24/11; H01L 2924/01015; H01L 2924/013; H01L 2224/1146; H01L 2224/8192; H01L 2224/05155; H01L 2224/45155; H01L 2224/13155; H01L 24/03; G01R 3/00;
   (Continued)

(56) References Cited

U.S. PATENT DOCUMENTS

| 7,679,389 B2* | 3/2010 | Kuniyoshi | G01R 1/06727 324/755.07 |
| 7,960,988 B2* | 6/2011 | Fukami | G01R 1/06727 324/754.03 |

(Continued)

FOREIGN PATENT DOCUMENTS

| JP | H04237809 A | 8/1992 |
| JP | 2003142189 A | 5/2003 |

(Continued)

OTHER PUBLICATIONS

Pillai et al, Electrodeposited nickel-phosphorous (Ni-P) alloy coating: an in-depth study of its preparation, properties, and structural transitions, Journal of Coatings Technology and Research, Apr. 19, 2012, pp. 785-797, vol. 9, No. 6, XP055710084, ISSN: 1547-0091, DOI: 10.1007/s11998-012-9411-0.

(Continued)

*Primary Examiner* — Vinh P Nguyen
(74) *Attorney, Agent, or Firm* — Viering, Jentschura & Partner MBB

(57) ABSTRACT

Provided is a contact probe which may achieve improved heat resistance even when a spring portion thereof is compressed and released in a high temperature environment. The contact probe includes an Ni—P layer, and the Ni—P layer has different concentrations of P at different positions in a thickness direction of the Ni—P layer.

20 Claims, 7 Drawing Sheets

(51) Int. Cl.
*C25D 3/12* (2006.01)
*C25D 5/14* (2006.01)
*C25D 5/12* (2006.01)
*C25D 1/04* (2006.01)
*G01R 35/00* (2006.01)
*C23C 18/16* (2006.01)
*C23C 18/42* (2006.01)
*C25D 1/20* (2006.01)
*C25D 3/56* (2006.01)

(52) U.S. Cl.
CPC ............... *C25D 5/14* (2013.01); *C25D 5/48* (2013.01); *G01R 1/06722* (2013.01); *G01R 35/00* (2013.01); *C23C 18/1653* (2013.01); *C23C 18/42* (2013.01); *C25D 1/20* (2013.01); *C25D 3/562* (2013.01)

(58) Field of Classification Search
CPC ............ G01R 1/06727; G01R 1/0735; G01R 1/06738; G01R 1/06761; G01R 1/06711; G01R 1/07357; G01R 1/06755; G01R 1/06733; G01R 31/2831; G01R 31/2887; G01R 1/06716; G01R 1/06722; G01R 1/07307; G01R 1/06744; G01R 1/073; G01R 1/07314; G01R 1/07342; G01R 1/0416; G01R 31/2886; G01R 31/2891; G01R 1/067; G01R 31/2801; G01R 31/2853; G01R 31/312; G01R 33/1207; G01R 33/14; G01R 33/285; G01R 35/00; H01R 12/714; H01R 13/03; H01R 13/187; H01R 13/2414; H01R 13/2464; H01R 43/16; H01R 39/025; H05K 1/036; H05K 2201/09881; H05K 2203/0369; H05K 2201/0272; H05K 2201/10371; H05K 7/00
See application file for complete search history.

(56) References Cited

U.S. PATENT DOCUMENTS

| | | | |
|---|---|---|---|
| 8,671,567 B2* | 3/2014 | Hirakawa | G01R 1/06733 |
| | | | 148/559 |
| 9,015,935 B2* | 4/2015 | Takeya | G01R 1/07357 |
| | | | 29/837 |
| 9,109,294 B2 | 8/2015 | Kojima et al. | |
| 10,024,908 B2* | 7/2018 | Ando | G01R 1/06716 |
| 2004/0259406 A1 | 12/2004 | Yoshida et al. | |
| 2012/0021170 A1 | 1/2012 | Hantschel et al. | |
| 2014/0028343 A1 | 1/2014 | Numata et al. | |
| 2017/0307657 A1* | 10/2017 | Crippa | G01R 1/06738 |

FOREIGN PATENT DOCUMENTS

| | | |
|---|---|---|
| JP | 2005332830 A | 12/2005 |
| JP | 2006228743 A | 8/2006 |
| JP | 2008066076 A | 3/2008 |
| JP | 2009094080 A | 4/2009 |
| JP | 2010174322 A | 8/2010 |
| JP | 4572303 B1 | 11/2010 |
| JP | 2010281607 A | 12/2010 |
| JP | 2112225865 A | 11/2012 |
| JP | 2014028343 A | 2/2014 |
| JP | 2016166899 A | 9/2016 |
| WO | 2008155864 A1 | 12/2008 |

OTHER PUBLICATIONS

Yamamoto et al., "Contact Probe and Electrical Connection Jig", U.S. Appl. No. 16/466,656, filed Jun. 5, 2019.

* cited by examiner

CONTACT PROBE

CROSS-REFERENCE TO RELATED APPLICATIONS

This application claims priority to Japanese Application No. 2017-104033 filed on May 25, 2017, which is entirely incorporated herein by reference.

TECHNICAL FIELD

The present disclosure relates to a contact probe used to test a specimen, such as, for example, a semiconductor integrated circuit.

BACKGROUND

Electronic components, such as, for example, an integrated circuit (IC), a large-scale integrated circuit (LSI), and a flat-panel display (FPD), which involve use of semiconductor devices, are generally subjected to tests, such as, for example, a continuity test and an insulation test, for electrical characteristic evaluation. In the continuity test, a testing apparatus including a large number of contact probes is used, and the contact probes are brought into contact with electrodes of a specimen, such as, for example, a semiconductor integrated circuit. As specimens have been becoming smaller, denser, and more sophisticated, there has been a demand for a reduction in diameter of contact probes which are brought into resilient contact with such a specimen at the time of a test.

Japanese Patent No. 4572303, for example, describes a method for manufacturing a contact probe for use in a continuity testing jig, the contact probe having an electroformed spring structure. This manufacturing method includes forming a gold plating layer on an outer periphery of a core by plating, and thereafter forming an electroformed Ni layer on an outer periphery of the formed gold plating layer by electroforming; forming a resist layer on an outer periphery of the electroformed Ni layer, and thereafter exposing the resist layer to laser light to define a spiral groove in the resist layer; conducting an etching with the resist layer used as a mask to remove a portion of the electroformed Ni layer on which the spiral groove is defined in the resist layer; removing the resist layer, and removing a portion of the gold plating layer which corresponds to the spiral groove and from which the portion of the electroformed Ni layer has been removed; and removing only the core while leaving the gold plating layer on an inner periphery of the electroformed Ni layer. This manufacturing method is able to manufacture an ultra-slim and thin contact probe for use in a continuity testing jig, the contact probe having an electroformed spring structure, with increased accuracy and precision.

SUMMARY

However, a test is sometimes conducted in a high temperature environment, e.g., at 120° C. or higher, and the contact probe having the structure as described in Japanese Patent No. 4572303 has a problem in that a hysteresis phenomenon (i.e., a plastic deformation) may occur in connection with the length of a spring portion of the contact probe. More specifically, at the time of a test, the contact probe is brought into resilient contact with a specimen with the spring portion of the contact probe being compressed, and then, the spring portion is released. However, after the release of the compression, the spring portion may not resume its original shape, remaining in the compressed state, resulting in a plastic deformation of the spring portion.

The present disclosure has been conceived in view of the above circumstances to provide a contact probe including a spring portion which is unlikely to experience a plastic deformation even when compressed and released in a high temperature environment, that is, a contact probe with improved heat resistance.

A contact probe according to an embodiment of the present disclosure includes an Ni—P layer, in which the Ni—P layer has different concentrations of P at different positions in a thickness direction of the Ni—P layer.

Regarding a non-limiting embodiment of the above-described contact probe, the Ni—P layer may include a first portion and a second portion arranged in an order named from an inner side of the Ni—P layer in the thickness direction of the Ni—P layer; and that the second portion is arranged to have a concentration of P lower than that of the first portion.

Regarding a non-limiting embodiment of the above-described contact probe, the Ni—P layer may include the first portion, the second portion, and a third portion arranged in an order named from the inner side of the Ni—P layer in the thickness direction of the Ni—P layer; and that the second portion is arranged to have a concentration of P lower than that of each of the first portion and the third portion.

Regarding a non-limiting embodiment of the above-described contact probe, the Ni—P layer may include the first portion, the second portion, the third portion, a fourth portion, and a fifth portion arranged in an order named from the inner side of the Ni—P layer in the thickness direction of the Ni—P layer; and that each of the second portion and the fourth portion is arranged to have a concentration of P lower than that of each of the first portion, the third portion, and the fifth portion.

Regarding a non-limiting embodiment of the above-described contact probe, an average concentration of P of the first portion may be in a range of 1.0 mass % to 5.0 mass % inclusive.

Regarding a non-limiting embodiment of the above-described contact probe, the second portion may be spaced from an innermost surface of the Ni—P layer by ¼ or more of a thickness of the Ni—P layer; and that an average concentration of P of the second portion is in a range of 0.5 mass % to 5.0 mass % inclusive.

Regarding a non-limiting embodiment of the above-described contact probe, in a given portion of the Ni—P layer, a highest concentration of P in the thickness direction may be 1.2 or more times a lowest concentration of P in the thickness direction.

Regarding a non-limiting embodiment of the above-described contact probe, an average concentration of P of a portion of the Ni—P layer which may be spaced from an innermost surface of the Ni—P layer by ⅛ of a thickness of the Ni—P layer and which has a thickness of ⅛ of the thickness of the Ni—P layer is higher than an average concentration of P of a portion of the Ni—P layer which is spaced from the innermost surface of the Ni—P layer by ⅝ of the thickness of the Ni—P layer and which has a thickness of ⅛ of the thickness of the Ni—P layer.

A non-limiting embodiment of the above-described contact probe may further include a layer different from the Ni—P layer and arranged outside of the Ni—P layer.

The contact probe according to a non-limiting embodiment of the present disclosure includes the Ni—P layer, and that the Ni—P layer has different concentrations of P at different positions in the thickness direction of the Ni—P layer. With the contact probe having the above structure, a portion of the Ni—P layer which has a relatively high concentration of P contributes to increased heat resistance and a reduced shrinkage of a spring portion of the contact probe, while a portion of the Ni—P layer which has a relatively low concentration of P contributes to increased toughness, which in turn reduces the likelihood of a plastic deformation of the spring portion.

DETAILED DESCRIPTION

Figure 1:
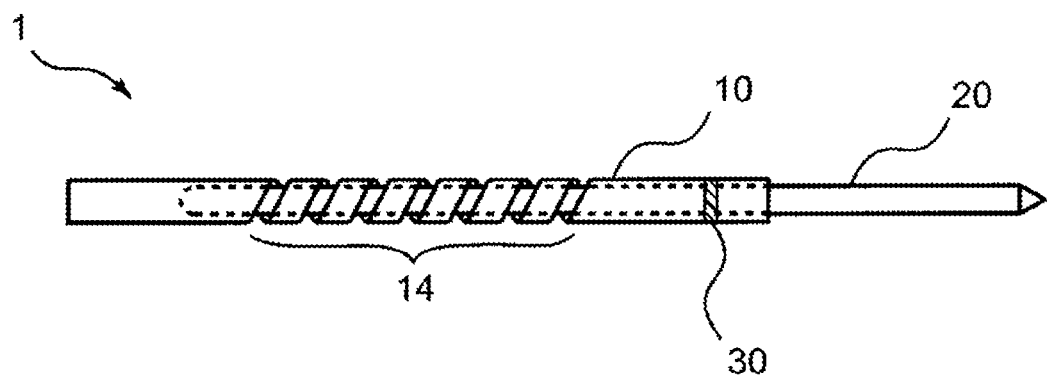
FIG. 1 is a side view of a contact probe according to an embodiment of the present disclosure.

While more specific embodiments of the present disclosure will be described below, it will be understood that the present disclosure is not limited to the embodiments described below, and that various modifications may be made to the embodiments appropriately without departing from the gist of the present disclosure as described above and below, and resulting embodiments fall within the technical scope of the present disclosure. Note that, in the accompanying drawings, hatched lines, reference characters, and so on may be omitted for the sake of convenience. In such a case, the specification and other drawings should be consulted. Also note that the dimensions of various members in the accompanying drawings may differ from the actual dimensions thereof, because the drawings are meant to contribute to an understanding of features of the present disclosure rather than showing the actual dimensions.

A contact probe according to an embodiment of the present disclosure is characterized in including an Ni—P layer, and in that the Ni—P layer has different concentrations of P at different positions in a thickness direction of the Ni—P layer. The above structure makes it possible to combine heat resistance and toughness of the contact probe.

The wording "heat resistance" of the Ni—P layer as used herein means resistance of a spring portion of the Ni—P layer to plastic deformation when the spring portion is compressed and released during use of the contact probe in a high temperature environment at about 120° C. or higher. A method for evaluating the heat resistance of the contact probe will be described below.

It is assumed herein that a direction leading from one end to the other end of the contact probe is referred to by the term "axial direction", "axial", or "axially". It is also assumed herein that a radial direction of the contact probe is referred to by the term "radial direction", "radial", or "radially", and that an inner side in the radial direction is a side on which a central axis of the contact probe lies, while an outer side in the radial direction is a side away from the central axis of the contact probe.

Figure 2:
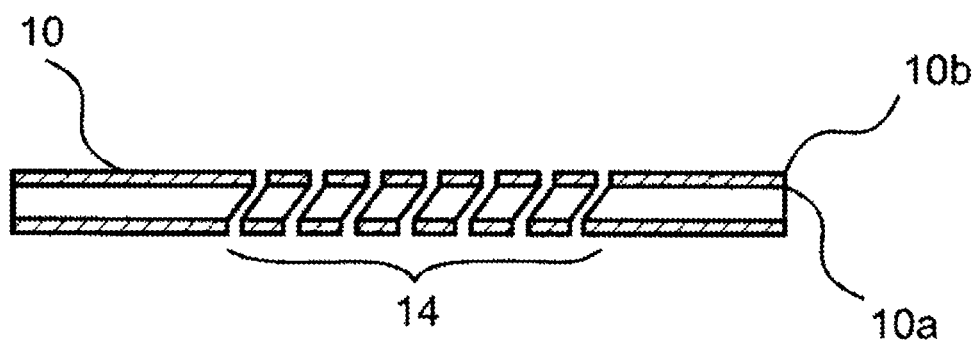
FIG. 2 is a sectional view of the contact probe according to an embodiment of the present disclosure taken along a plane including an axis of the contact probe.

Referring to FIGS. 1 and 2, a contact probe 1 according to an embodiment of the present disclosure includes an Ni—P layer 10. The contact probe 1 includes a coil-shaped spring portion 14 in at least a portion thereof. The spring portion 14 of the contact probe 1 enables the contact probe 1 to expand and contract in an axial direction. Ni—P layers according to embodiments of the present disclosure will be described below.

The Ni—P layer 10 is made up of an Ni (nickel) plating layer containing P (phosphorus) as an alloy component, and has different concentrations of P at different positions in the thickness direction of the Ni—P layer 10. The thickness direction of the Ni—P layer 10 refers to a direction leading from an innermost surface 10a to an outermost surface 10b of the Ni—P layer 10. That is, the concentration of P varies at different depths from the outermost surface 10b of the Ni—P layer 10.

A portion of the Ni—P layer 10 which has a high concentration of P contributes to increasing the heat resistance of the contact probe 1. This in turn contributes to reducing plastic deformation of the spring portion 14 of the contact probe 1 when the spring portion 14 is compressed and released in a high temperature environment.

The concentration of P in the Ni—P layer 10 can be measured by performing energy-dispersive X-ray spectroscopy (EDX) on a surface of the Ni—P layer 10. In this measuring method, a plurality of specific points are set in the Ni—P layer 10, and the average of values measured at the plurality of specific points is calculated. The specific points may be set in any desired manner. For example, the specific points may be set at regular intervals along the length of the Ni—P layer 10. Grinding or etching may be performed on the Ni—P layer 10 in the thickness direction thereof to make it possible to subject portions having different thicknesses to measurement to recognize the constitution of the Ni—P layer in the thickness direction thereof. A surface of a target object is subjected to ethanol washing to expose the Ni—P layer 10 before measurement, and an EDX measurement is performed on the exposed surface of the Ni—P layer 10. An apparatus that has an SEM and EDX integrated therein, for example, may be used for the measurement. An electron beam of 15 kV and 80 μA may be used. The concentration of P is measured at five points along the length of the Ni—P layer 10 (i.e., along the axial direction), and the average thereof is calculated.

A portion of the Ni—P layer 10 which has a low concentration of P contributes to increasing the toughness of the contact probe 1. An increase in the concentration of P in an Ni—P alloy leads to increased heat resistance, but leads to reduced toughness, which may make the Ni—P alloy fragile. Accordingly, the Ni—P layer 10 is provided with not only a portion having a high concentration of P but also a portion having a low concentration of P to increase the toughness of the contact probe 1 while ensuring sufficient heat resistance of the contact probe 1.

In addition, a plating of a portion of the Ni—P alloy which has a low concentration of P is formed faster than a plating of a portion of the Ni—P alloy which has a high concentration of P. This is because the portion of the Ni—P alloy which has a low concentration of P experiences a high electric current density when the plating is formed, and the high electric current density leads to an increased thickness of the plating. Therefore, since the Ni—P layer 10 is provided with not only the portion having a high concentration of P but also the portion having a low concentration of P, an increased productivity of the Ni—P layer 10 is achieved, because the portion having a low concentration of P experiences a high electric current density, leading to an increased thickness of the plating, when the plating is formed, and thus contributes to accelerating the formation of the Ni—P layer 10.

Figure 7:
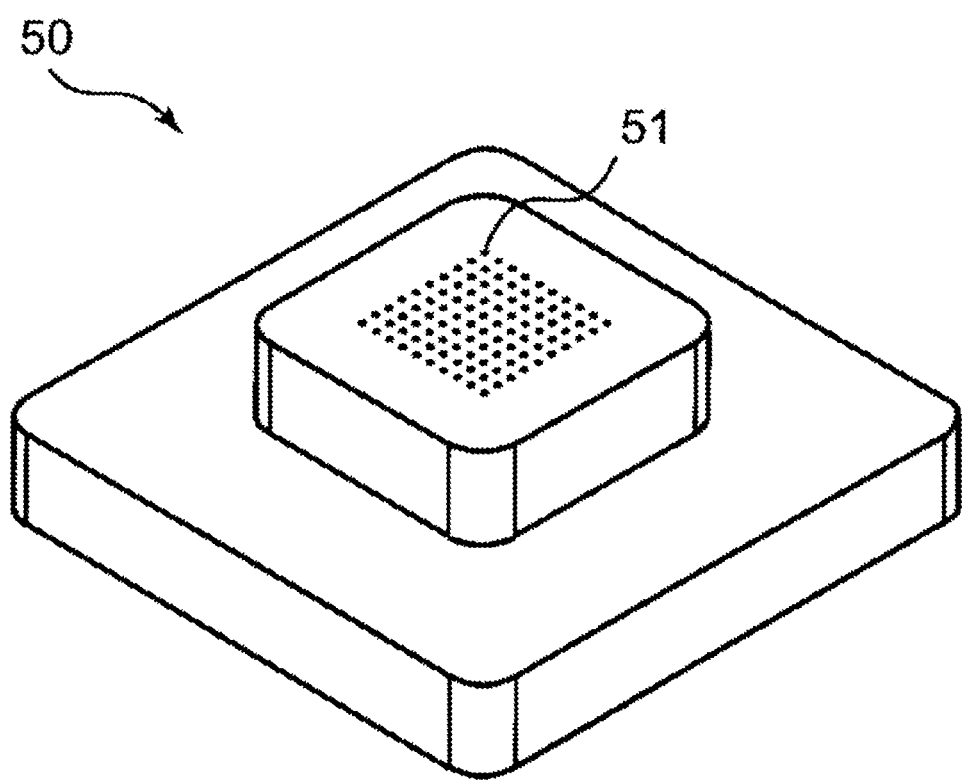
FIG. 7 is a perspective view of a jig (i.e., a housing) used in an evaluation test for heat resistance of the Ni—P layer according to an embodiment of the present disclosure.
Figure 8:
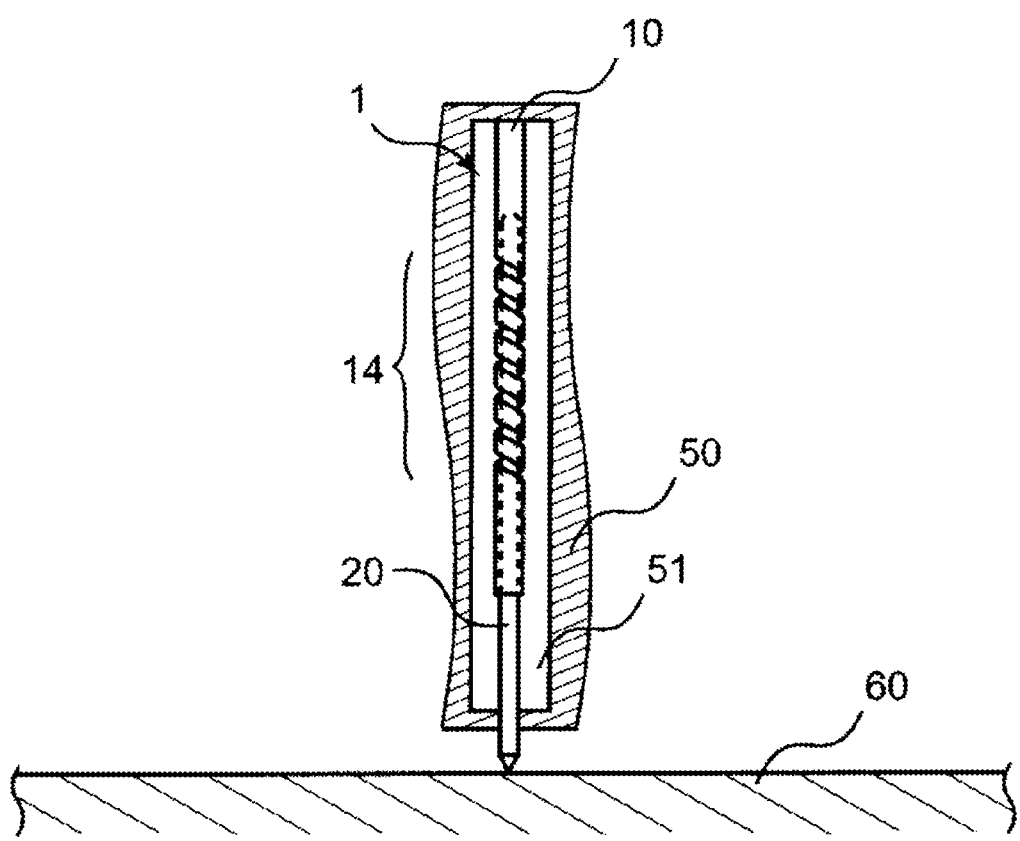
FIG. 8 is a sectional view illustrating the contact probe and its vicinity during the evaluation test for the heat resistance of the Ni—P layer according to an embodiment of the present disclosure.

The heat resistance of the contact probe 1, which includes the Ni—P layer 10, is evaluated in the following manner. Referring to FIG. 7, a housing 50 is made of a metal, and is in the shape of a box. A plurality of holes 51, each of which is arranged to accommodate the contact probe 1 therein, are defined at one surface of the housing 50. Referring to FIG. 8, the contact probe 1 is accommodated in the corresponding hole 51 with a plunger 20 thereof arranged on the opening side. At this time, a tip of the plunger 20 protrudes from the hole 51.

Figure 9:
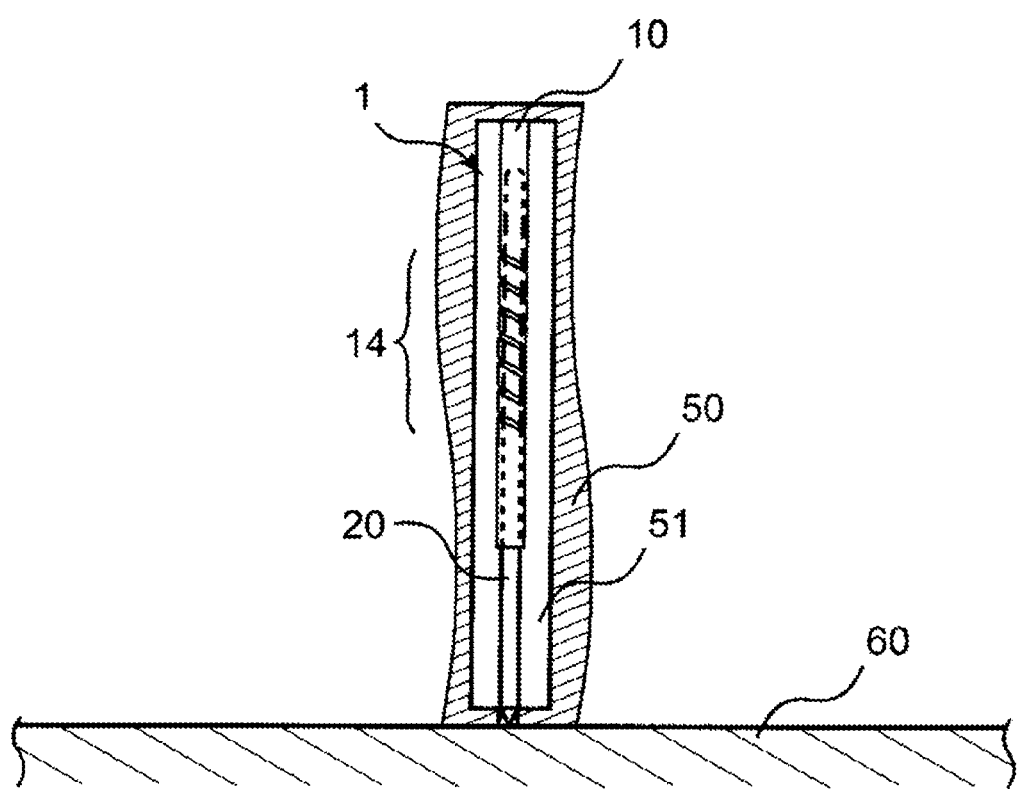
FIG. 9 is a sectional view illustrating the contact probe in a compressed state and its vicinity during the evaluation test for the heat resistance of the Ni—P layer according to an embodiment of the present disclosure.

The housing 50 is mounted on a hot plate 60 with an opening portion of each hole 51 facing downward and the hot plate 60 set at a predetermined evaluation temperature. The length of a portion of the plunger 20 which protrudes from the hole 51 is set so that the Ni—P layer 10 will be compressed by a distance substantially equal to a maximum stroke (i.e., 330 μm) thereof. Thus, when a weight (not shown) having a predetermined weight is placed on the housing 50, for example, the contact probe 1 can be maintained in the state of being compressed by the distance substantially equal to the maximum stroke as illustrated in FIG. 9.

The contact probe 1 is maintained in this state for 20 hours. Thereafter, the contact probe 1 is removed from the hole 51 in an ordinary temperature environment, and an overall length of the contact probe 1 is measured with the contact probe 1 oriented horizontally and no load applied to the contact probe 1. A difference between the measured overall length and an overall length of the contact probe 1 before being maintained in the aforementioned state for the aforementioned time is defined as a "shrinkage" for the evaluation temperature. Lower values of the shrinkage mean greater durability in a high temperature environment.

The shrinkage for each evaluation temperature was measured with respect to thirty contact probes 1, and the average thereof was determined as the shrinkage for the evaluation temperature. In this evaluation test, a shrinkage of 50 μm or less (i.e., 0.05 mm or less) was set as a reference for a given temperature, and the contact probes 1 were determined to be usable in a temperature environment demanded by the test when the shrinkage was 50 μm or less.

The Ni—P layer 10 may be in any desired shape, examples of which include the shape of a circular tube and the shape of a polygonal tube. However, it is particularly preferable that the Ni—P layer 10 is in the shape of a circular tube. The Ni—P layer 10 being in this shape facilitates a production of the Ni—P layer 10, and makes it easier to make the heat resistance and toughness of the Ni—P layer 10 uniform throughout the entire Ni—P layer 10. Note that a slit extending in the axial direction may be defined in the Ni—P layer 10. The slit defined in the Ni—P layer 10 will increase the surface area of the Ni—P layer 10, making it easier for heat added to the Ni—P layer 10 to escape, and reducing the likelihood of a plastic deformation of the contact probe 1.

Figure 3:
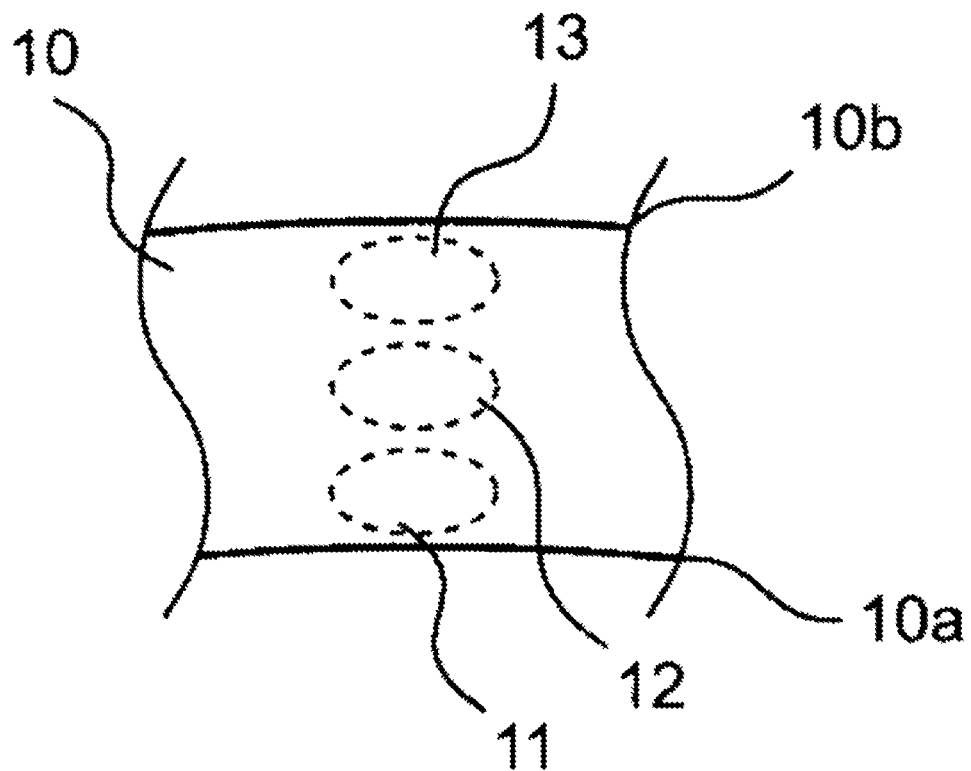
FIG. 3 is an enlarged view of a portion of a cross section of the contact probe according to an embodiment of the present disclosure.

Referring to FIG. 3, the Ni—P layer 10 may include a first portion 11, a second portion 12, and a third portion 13 arranged in the order named from the inner side of the Ni—P layer 10 in the thickness direction of the Ni—P layer 10, with the second portion 12 having a concentration of P lower than that of each of the first portion 11 and the third portion 13. The first portion 11 is a portion of the Ni—P layer 10 which has a thickness of ⅛ of the thickness of the Ni—P layer 10, and which has an average concentration of P higher than that of an outermost portion of the Ni—P layer 10 which has a thickness of ⅛ of the thickness of the Ni—P layer 10 and that of an innermost portion of the Ni—P layer 10 which has a thickness of ⅛ of the thickness of the Ni—P layer 10. The second portion 12 is a portion of the Ni—P layer 10 which has a thickness of ⅛ of the thickness of the Ni—P layer 10, which has an average concentration of P lower than that of the first portion 11, and which is arranged outside of the first portion 11. The third portion 13 is a portion of the Ni—P layer 10 which has a thickness of ⅛ of the thickness of the Ni—P layer 10, which has an average concentration of P higher than that of the second portion 12, and which is arranged outside of the second portion 12.

The first portion 11 may be arranged inside of and contiguous to the second portion 12, or alternatively, a portion different from the first and second portions 11 and 12 may be arranged between the first and second portions 11 and 12. When the first portion 11 is arranged inside of and contiguous to the second portion 12, heat resistance and toughness can be combined at a portion of the Ni—P layer 10 in which the first and second portions 11 and 12 lie. When the portion different from the first and second portions 11 and 12 is arranged between the first and second portions 11 and 12, a gentle transition from a highly heat-resistant portion to a highly tough portion can be achieved in a region from a portion of the Ni—P layer 10 in which the first portion 11 lies to a portion of the Ni—P layer 10 in which the second portion 12 lies, resulting in a better balance between heat resistance and toughness.

Similarly, the third portion 13 may be arranged outside of and contiguous to the second portion 12, or alternatively, a portion different from the second and third portions 12 and 13 may be arranged between the second and third portions 12 and 13. When the third portion 13 is arranged outside of and contiguous to the second portion 12, heat resistance and toughness can be combined at a portion of the Ni—P layer 10 in which the second and third portions 12 and 13 lie. When the portion different from the second and third portions 12 and 13 is arranged between the second and third portions 12 and 13, a gentle transition from a highly tough but poorly heat-resistant portion to a highly heat-resistant but relatively fragile portion can be achieved in a region from the portion of the Ni—P layer 10 in which the second portion 12 lies to a portion of the Ni—P layer 10 in which the third portion 13 lies, resulting in a better balance between heat resistance and toughness.

The Ni—P layer 10 includes a first portion 11 and a second portion 12 arranged in the order named from the inner side of the Ni—P layer 10 in the thickness direction of the Ni—P layer 10, with the second portion 12 having a concentration of P lower than that of the first portion 11. The Ni—P layer 10 includes a first portion 11, a second portion 12, a third portion 13, a fourth portion, and a fifth portion arranged in the order named from the inner side of the Ni—P layer 10 in the thickness direction of the Ni—P layer 10, with each of the second portion 12 and the fourth portion having a concentration of P lower than that of each of the first portion 11, the third portion 13, and the fifth portion.

An average concentration of P of the first portion 11 may be higher than an average concentration of P of the second portion 12, and equal to or greater than 1.0 mass %, alternatively equal to or greater than 1.5 mass %, or to or greater than 2.0 mass % in another non-limiting embodiment. Setting a lower limit of the average concentration of P in any of the above manners ensures sufficient heat resistance of an inside portion of the Ni—P layer 10, and leads to improved durability of the Ni—P layer 10 against a heat transferred from a space radially inside of the Ni—P layer 10. In addition, the average concentration of P of the first portion 11 may be equal to or smaller than 5.0 mass %, alternatively equal to or smaller than 4.5 mass %, or equal to or smaller than 4.0 mass % in another non-limiting embodiment. Setting an upper limit of the average concentration of P in any of the above manners ensures sufficient toughness and sufficient heat resistance of the inside portion of the Ni—P layer 10 at the same time. In addition, although it may be sufficient if the first portion 11 is arranged inside of the second portion 12, the first portion 11 may be spaced from the innermost surface 10a of the Ni—P layer 10 by ⅛ or more of the thickness of the Ni—P layer 10, alternatively by 3/20 or more of the thickness of the Ni—P layer 10, or by 3/16 or more of the thickness of the Ni—P layer 10 in another non-limiting embodiment. The above location of the first portion 11 makes it possible to ensure sufficient heat resistance and sufficient toughness of the inside portion of the Ni—P layer 10.

The average concentration of P of the second portion 12 may be lower than the average concentration of P of the first portion 11, and equal to or greater than 0.5 mass %, alternatively equal to or greater than 0.7 mass %, or equal to or greater than 1.0 mass % in another non-limiting embodiment. Setting a lower limit of the average concentration of P in any of the above manners contributes to ensuring sufficient heat resistance of an intermediate portion of the Ni—P layer 10 in the thickness direction of the Ni—P layer 10 as well. In addition, the average concentration of P of the second portion 12 may be equal to or smaller than 5.0 mass %, alternatively equal to or smaller than 3.0 mass %, alternatively equal to or smaller than 2.0 mass %, alternatively equal to or smaller than 1.8 mass %, or equal to or smaller than 1.5 mass % in another non-limiting embodiment. Setting an upper limit of the average concentration of P in any of the above manners enables the intermediate portion of the Ni—P layer 10 in the thickness direction of the Ni—P layer 10 to be tough enough to support the first portion 11 and the third portion 13, each of which has a high heat resistance, from a position between the first portion 11 and the third portion 13, and thus leads to a better balance between heat resistance and toughness of the Ni—P layer 10 as a whole. In addition, although it may be sufficient if the second portion 12 is arranged between the first portion 11 and the third portion 13, the second portion 12 may be spaced from the innermost surface 10a of the Ni—P layer 10 by ¼ or more of the thickness of the Ni—P layer 10, alternatively by ⅜ or more of the thickness of the Ni—P layer 10, or by 7/16 or more of the thickness of the Ni—P layer 10 in another non-limiting embodiment. The above location of the second portion 12 allows both the first portion 11 and the third portion 13 to be supported by the second portion 12, and thus allows the Ni—P layer 10 to have a high degree of toughness as well as a high heat resistance.

An average concentration of P of the third portion 13 may be equal to or greater than 1.0 mass %, alternatively equal to or greater than 1.5 mass %, or equal to or greater than 2.0 mass % in another non-limiting embodiment. Setting a lower limit of the average concentration of P in any of the above manners ensures sufficient heat resistance of the outermost surface 10b of the Ni—P layer 10, which leads to ensuring sufficient heat resistance of the Ni—P layer 10 against a heat transferred from a space radially outside of the Ni—P layer 10. In addition, the average concentration of P of the third portion 13 may be equal to or smaller than 5.0 mass %, alternatively equal to or smaller than 4.5 mass %, or equal to or smaller than 4.0 mass % in another non-limiting embodiment. Setting an upper limit of the average concentration of P in any of the above manners ensures sufficient toughness and sufficient heat resistance of the outermost surface 10b of the Ni—P layer 10 at the same time. In addition, although it may be sufficient if the third portion 13 is arranged outside of the second portion 12, the third portion 13 may be spaced from the innermost surface 10a of the Ni—P layer 10 by ¾ or more of the thickness of the Ni—P layer 10, alternatively by 13/16 or more of the thickness of the Ni—P layer 10, or by ⅞ or more of the thickness of the Ni—P layer 10 in another non-limiting embodiment. The above location of the third portion 13 makes it possible to ensure sufficient heat resistance and sufficient toughness of the outermost surface 10b and its vicinity of the Ni—P layer 10.

Note that the average concentration of P of the third portion 13 may be either equal to or different from the average concentration of P of the first portion 11. When the average concentration of P of the third portion 13 is arranged to be equal to the average concentration of P of the first portion 11, the outermost surface 10b and the inside portion of the Ni—P layer 10 will have substantially the same heat resistance and toughness, resulting in a better balance between heat resistance and toughness of the Ni—P layer 10 as a whole. When the average concentration of P of the first portion 11 is arranged to be higher than the average concentration of P of the third portion 13, the inside portion of the Ni—P layer 10 will have a heat resistance higher than that of the outermost surface 10b of the Ni—P layer 10, allowing the contact probe 1 to be suitably used, for example, in a case where heat is more easily added to the inside portion of the Ni—P layer 10 than to the outermost surface 10b of the Ni—P layer 10, e.g., in a case where heat is added to the plunger 20, which will be described below. In contrast, when the average concentration of P of the first portion 11 is arranged to be lower than the average concentration of P of the third portion 13, the outermost surface 10b of the Ni—P layer 10 will have a heat resistance higher than that of the inside portion of the Ni—P layer 10, allowing the contact probe 1 to be suitably used, for example, in a case where heat is more easily added to the outermost surface 10b of the Ni—P layer 10 than to the inside portion of the Ni—P layer 10, e.g., in a case where the Ni—P layer 10 has a thermal conductivity higher than that of the plunger 20.

An average concentration of P of the fourth portion may be lower than the average concentration of P of each of the first portion 11, the third portion 13, and the fifth portion, and equal to or greater than 0.5 mass %, alternatively equal to or greater than 0.7 mass %, or equal to or greater than 1.0 mass % in another non-limiting embodiment. In addition, the average concentration of P of the fourth portion may be equal to or smaller than 5.0 mass %, alternatively equal to or smaller than 3.0 mass %, alternatively equal to or smaller than 2.0 mass %, alternatively equal to or smaller than 1.8 mass %, or equal to or smaller than 1.5 mass % in another non-limiting embodiment. Note that the average concentration of P of the fourth portion may be either equal to or different from the average concentration of P of the second portion 12.

The average concentration of P of the fifth portion may be higher than the average concentration of P of each of the second portion 12 and the fourth portion, and equal to or greater than 1.0 mass %, alternatively equal to or greater than 1.5 mass %, or equal to or greater than 2.0 mass % in another non-limiting embodiment. In addition, the average concentration of P of the fifth portion may be equal to or smaller than 5.0 mass %, alternatively equal to or smaller than 4.5 mass %, or equal to or smaller than 4.0 mass % in another non-limiting embodiment. Note that the average concentration of P of the fifth portion may be either equal to or different from the average concentration of P of each of the first portion 11 and the third portion 13.

An average concentration of P of the Ni—P layer 10 as a whole may be equal to or greater than 0.5 mass %, alternatively equal to or greater than 1.0 mass %, or equal to or greater than 2.0 mass % in another non-limiting embodiment. Setting a lower limit of the average concentration of P in any of the above manners allows the contact probe 1 to have sufficient heat resistance. In addition, the average concentration of P of the Ni—P layer 10 as a whole may be equal to or smaller than 10 mass %, alternatively equal to or smaller than 5.0 mass %, or equal to or smaller than 4.0 mass % in another non-limiting embodiment. Setting an upper limit of the average concentration of P in any of the above manners allows the contact probe 1 to have sufficient toughness while ensuring sufficient heat resistance of the contact probe 1.

The highest concentration of P in the thickness direction in a given portion of the Ni—P layer 10 may be 1.2 or more times, alternatively 1.5 or more times, or 1.8 or more times in another non-limiting embodiment, the lowest concentration of P in the thickness direction in the given portion. Setting lower limits of the highest and lowest concentrations of P in the given portion in any of the above manners contributes to ensuring sufficient heat resistance of the Ni—P layer 10. In addition, the highest concentration of P in the thickness direction in a given portion of the Ni—P layer 10 may be 3.5 or less times, alternatively 3.3 or less times, or 3.0 or less times in another non-limiting embodiment, the lowest concentration of P in the thickness direction in the given portion. Setting upper limits of the highest and lowest concentrations of P in the given portion in any of the above manners contributes to combining sufficient heat resistance and sufficient toughness of the Ni—P layer 10.

An average concentration of P of a portion of the Ni—P layer 10 which is spaced from the innermost surface 10a by ⅛ of the thickness of the Ni—P layer 10 and which has a thickness of ⅛ of the thickness of the Ni—P layer 10 may be higher than an average concentration of P of a portion of the Ni—P layer 10 which is spaced from the innermost surface 10a by ⅝ of the thickness of the Ni—P layer 10 and which has a thickness of ⅛ of the thickness of the Ni—P layer 10. The above arrangement of the average concentrations of P of the aforementioned portions of the Ni—P layer 10 contributes to increasing the toughness of the Ni—P layer 10 while ensuring sufficient heat resistance of the Ni—P layer 10.

The average concentration of P of the portion of the Ni—P layer 10 which is spaced from the innermost surface 10a by ⅛ of the thickness of the Ni—P layer 10 and which has a thickness of ⅛ of the thickness of the Ni—P layer 10 may be 1.2 or more times, alternatively 1.5 or more times, or 1.8 or more times in another non-limiting embodiment, the average concentration of P of the portion of the Ni—P layer 10 which is spaced from the innermost surface 10a by ⅝ of the thickness of the Ni—P layer 10 and which has a thickness of ⅛ of the thickness of the Ni—P layer 10. The above setting of lower limits of the average concentrations of P in the Ni—P layer 10 contributes to ensuring sufficient heat resistance of the Ni—P layer 10. In addition, the average concentration of P of the portion of the Ni—P layer 10 which is spaced from the innermost surface 10a by ⅛ of the thickness of the Ni—P layer 10 and which has a thickness of ⅛ of the thickness of the Ni—P layer 10 may be 3.5 or less times, alternatively 3.3 or less times, or 3.0 or less times in another non-limiting embodiment, the average concentration of P of the portion of the Ni—P layer 10 which is spaced from the innermost surface 10a by ⅝ of the thickness of the Ni—P layer 10 and which has a thickness of ⅛ of the thickness of the Ni—P layer 10. The above setting of upper limits of the average concentrations of P in the Ni—P layer 10 leads to an appropriate balance between heat resistance and toughness of the Ni—P layer 10.

A rate of decrease in the concentration of P in a portion of the Ni—P layer 10 which is spaced from the innermost surface 10a by ¼ of the thickness of the Ni—P layer 10 and which has a thickness of ⅜ of the thickness of the Ni—P layer 10 may be equal to or greater than 0.15 mass %/μm, alternatively equal to or greater than 0.20 mass %/μm, or equal to or greater than 0.25 mass %/μm in another non-limiting embodiment. Setting a lower limit of the rate of decrease in the concentration of P in the aforementioned portion of the Ni—P layer 10 in any of the above manners contributes to ensuring sufficient heat resistance of an inside portion of the Ni—P layer 10 and sufficiently improving the toughness of an intermediate portion of the Ni—P layer 10 in the portion of the Ni—P layer 10 which is spaced from the innermost surface 10a by ¼ of the thickness of the Ni—P layer 10 and which has a thickness of ⅜ of the thickness of the Ni—P layer 10. In addition, the rate of decrease in the concentration of P in the portion of the Ni—P layer 10 which is spaced from the innermost surface 10a by ¼ of the thickness of the Ni—P layer 10 and which has a thickness of ⅜ of the thickness of the Ni—P layer 10 may be equal to or smaller than 0.70 mass %/μm, alternatively equal to or smaller than 0.65 mass %/μm, or equal to or smaller than 0.6 mass %/μm in another non-limiting embodiment. Setting an upper limit of the rate of decrease in the concentration of P in the aforementioned portion of the Ni—P layer 10 in any of the above manners contributes to reducing a variation in heat resistance and a variation in toughness, resulting in a better balance between heat resistance and toughness, in the portion of the Ni—P layer 10 which is spaced from the innermost surface 10a by ¼ of the thickness of the Ni—P layer 10 and which has a thickness of ⅜ of the thickness of the Ni—P layer 10.

A material of the Ni—P layer 10 includes an alloy of Ni (nickel) and P (phosphorus), and may contain an additional alloy component. It is desirable that impurities or the like that are inevitably introduced into the material in a production process or the like are as few as possible. Examples of components other than Ni and P that may be contained in the Ni—P layer 10 include C (carbon) and O (oxygen).

The Ni—P layer 10 according to an embodiment of the present disclosure has a space extending in the axial direction radially inside thereof, and has the plunger 20 inserted into this space and joined to the Ni—P layer 10.

If a specimen is brought into contact with the tip of the plunger 20 of the contact probe 1, a pressure is applied to the contact probe 1 in a direction away from the specimen. This pressure compresses the spring portion 14 of the Ni—P layer 10. At this time, resilience of the spring portion 14, which enables the spring portion 14 in the state of being compressed to resume its original state, causes the tip of the plunger 20 to be in contact with the specimen with a specific pressure. The contact probe 1 and the specimen can thus be brought into resilient contact with each other.

Regarding the number of spring portions 14 included in each Ni—P layer 10, the Ni—P layer 10 may include only one spring portion 14, or may alternatively include a plurality of spring portions 14 arranged in the axial direction. The number of spring portions 14 included in each Ni—P layer 10 may be determined in accordance with the shape of a specimen, a contact pressure between the contact probe 1 and the specimen, etc. For example, in the case where the Ni—P layer 10 includes only one spring portion 14, a constant contact pressure between the contact probe 1 and the specimen can be achieved. In the case where the Ni—P layer 10 includes a plurality of spring portions 14, a load applied to the spring portions 14 can be distributed among the spring portions 14, making it less likely for each spring portion 14 to experience a plastic deformation.

The plunger 20 may be in any desired shape, examples of which include a columnar shape, the shape of a circular tube, a conical shape, the shape of a polygonal prism, the shape of a polygonal tube, and the shape of a polygonal pyramid. The plunger 20 may have a columnar shape. This shape of the plunger 20 will smooth sliding action between the Ni—P layer 10 and the plunger 20.

The tip of the plunger 20 may be in any desired shape, examples of which include a conical shape, a semicircular shape, a flat shape, and a crown-like shape. Any desired shape of the tip of the plunger 20 may be appropriately adopted depending on the use of the plunger 20.

A material of the plunger 20 may be any desired electric conductor, examples of which include Pt (platinum), Rh (rhodium), a Pt—Rh alloy, W (tungsten) plated with Ni and additionally Au (gold), and a Be (beryllium)—Cu (copper) alloy.

The plunger 20 may be joined to the Ni—P layer 10 by any desired method. For example, after the plunger 20 is inserted into the space radially inside of the Ni—P layer 10, the plunger 20 may be joined to the Ni—P layer 10 at a joint 30 by crimping the Ni—P layer 10, by welding the Ni—P layer 10 and the plunger 20 to each other, or by adhering the Ni—P layer 10 and the plunger 20 to each other. The Ni—P layer 10 is welded and thus joined to the plunger 20 at the joint 30. The joining of the Ni—P layer 10 and the plunger 20 by this method can be accomplished easily and so securely that the Ni—P layer 10 and the plunger 20 will not be separated from each other even if they are used in a high temperature environment.

Figure 10:
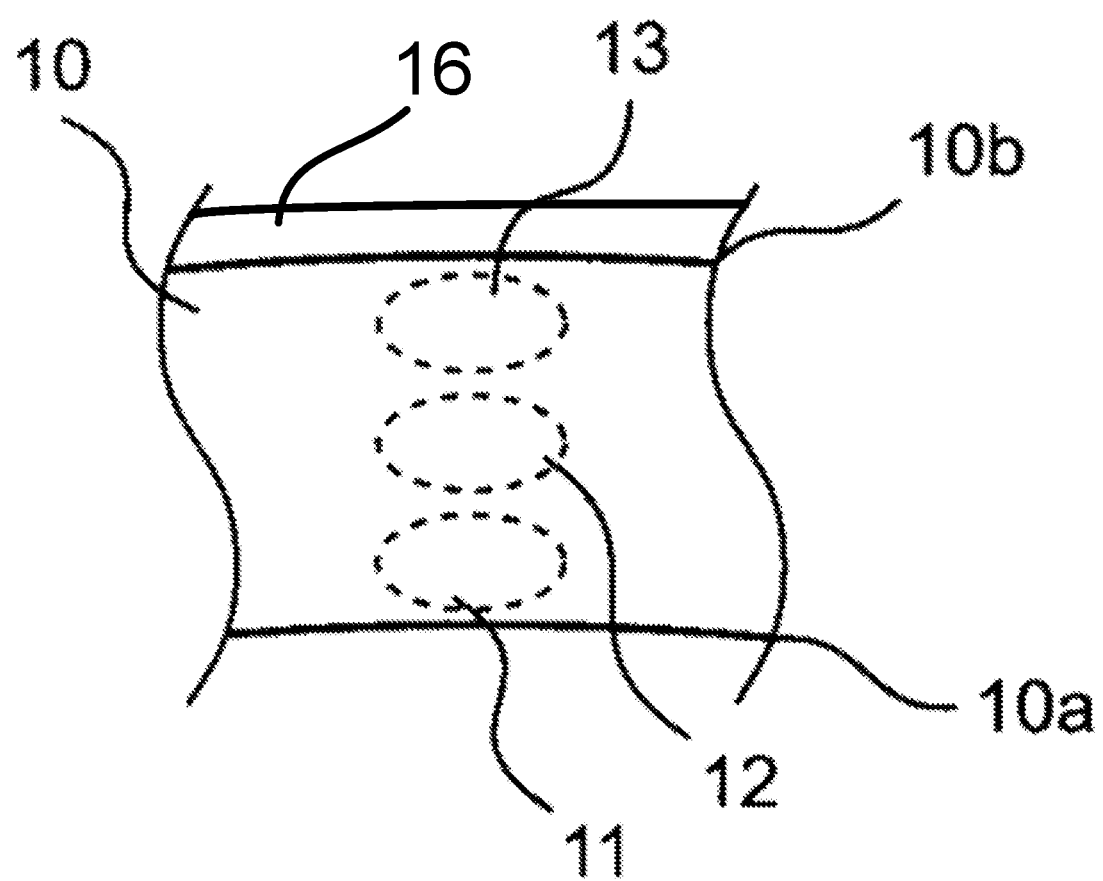
FIG. 10 is an enlarged view of a portion of a cross section of the contact probe according to an embodiment of the present disclosure.

The contact probe 1 may further include a layer 16 different from the Ni—P layer 10 on the outermost surface 10b of the Ni—P layer 10, as may be shown in FIG. 10 in a non-limiting embodiment. For example, an Ni plating layer may be arranged on the outermost surface 10b of the Ni—P layer 10 to give a nickel luster to an external appearance of the contact probe 1. Examples of such an Ni plating layer include a pure nickel plating layer and an Ni alloy plating containing an alloy component other than P (e.g., an Ni—B (boron) plating layer, an Ni—N (nitrogen) plating layer, etc.). Moreover, depending on the target for which the contact probe 1 is used, the environment for use of the contact probe 1, etc., the Ni plating layer may be replaced with a plating layer of Au, Ag (silver), Rh, or the like, or a plating layer of Au, Ag, Rh, or the like may be provided outside or inside of the Ni plating layer or both outside and inside of the Ni plating layer.

The contact probe 1 may further include an Au plating layer arranged on the innermost surface 10a of the Ni—P layer 10. The Au plating layer arranged on the innermost surface 10a of the Ni—P layer 10 would facilitate the production of the Ni—P layer 10, which will be described below.

An example of a method for producing the Ni—P layer 10 will now be described in detail below. Note that the method for producing the Ni—P layer 10 is not limited to this example.

Figure 4:
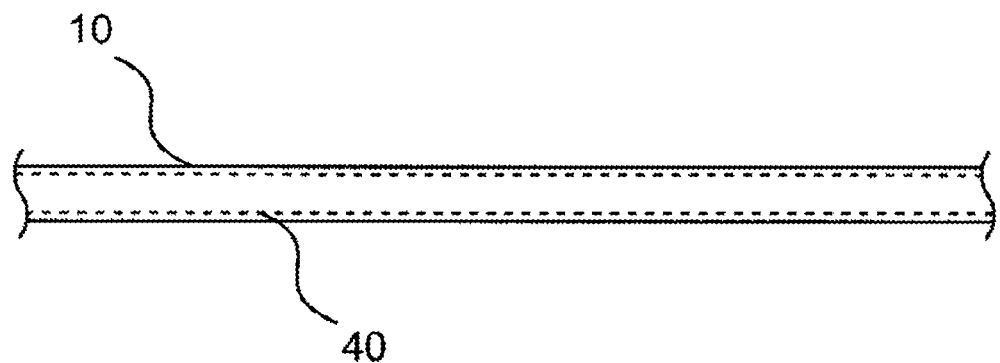
FIG. 4 is a schematic diagram of a core with an Ni—P layer formed thereon, illustrating a production of the Ni—P layer according to an embodiment of the present disclosure.

Referring to FIG. 4, a core 40 is first prepared, and then, the Ni—P layer 10 is formed on an outer periphery of the core 40 by electroplating. Any desired method may be employed for the electroplating. Examples of the core 40 include metal wires made of stainless steel, aluminum, and so on.

To cause the Ni—P layer 10 to contain P, a phosphorus compound, such as, for example, a phosphoric acid or a phosphorous acid, may be mixed into an Ni-containing plating solution, for example. Specifically, when the phosphorous acid is used, for example, the concentration of the phosphorous acid is arranged to be 35.0 g/L or less, for example. Nickel sulfamate or the like, for example, can be used for the Ni-containing plating solution.

The concentration of P in the Ni—P layer 10 can be adjusted by adjusting the concentration of the phosphorous acid in the Ni-containing plating solution. Thus, the concentration of P in the Ni—P layer 10 can be increased by, for example, increasing the concentration of the phosphorous acid in the Ni-containing plating solution.

Figure 5:
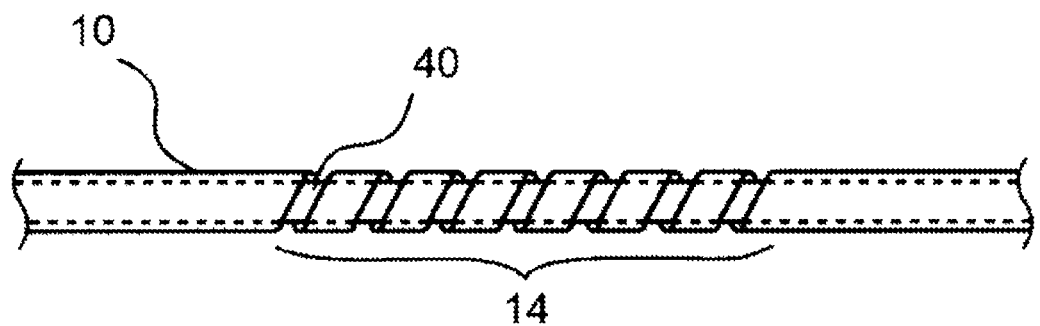
FIG. 5 is a schematic diagram of the Ni—P layer with a spring portion formed therein, illustrating the production of the Ni—P layer according to an embodiment of the present disclosure.

Next, referring to FIG. 5, the Ni—P layer 10 is subjected to patterning to form the spring portion 14. Photolithography, for example, may be used for the patterning. Specifically, a resist layer (not shown) is first formed on an outer periphery of the Ni—P layer 10. Then, the resist layer is exposed to laser light while the core 40 is being rotated, to define a spiral groove in the resist layer. The Ni—P layer 10 is subjected to etching with the resist layer remaining on the outer periphery of the Ni—P layer 10 used as a mask. As a result, the spring portion 14 is formed in the Ni—P layer 10.

Figure 6:
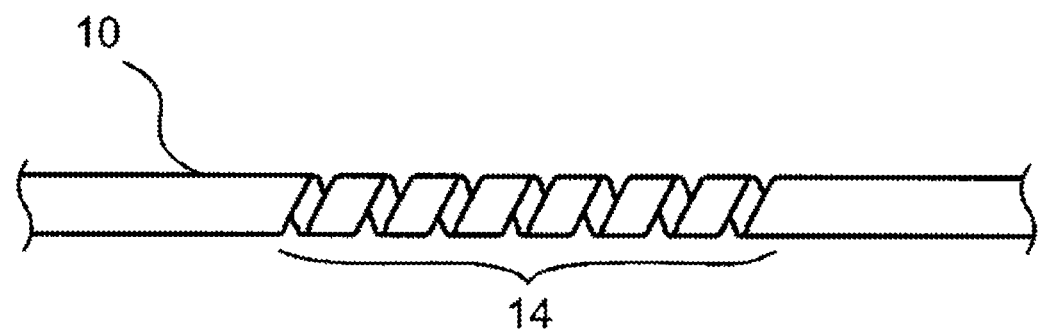
FIG. 6 is a schematic diagram of the Ni—P layer after the core is removed therefrom, illustrating the production of the Ni—P layer according to an embodiment of the present disclosure.

Next, referring to FIG. 6, the core 40 is removed after the spring portion 14 is formed in the Ni—P layer 10. The removal of the core 40 can be accomplished by, for example, pulling the core 40 from one side or from both sides to deform the core 40 such that the cross-sectional area of the core 40 is reduced, and pulling out the core 40 in this condition.

The Ni—P layer 10 of the contact probe 1, which includes the spring portion 14, can be produced by the above-described processes.

A thin gold-containing layer (not shown) may be formed on the outer periphery of the core 40 by, for example, plating before the Ni—P layer 10 is formed. That is, the gold-containing layer may be formed on the outer periphery of the core 40, and then, the Ni—P layer 10 is formed on an outer periphery of the gold-containing layer. The formation of the gold-containing layer will contribute to preventing an etchant from reaching an inner periphery of the Ni—P layer 10 during the patterning. In addition, in the case where the core 40 is made of stainless steel, which is not easily adhered to the gold-containing layer, the gold-containing layer will facilitate the removal of the core 40. The gold-containing layer may be arranged to have a thickness in the range of 0.2 μm to 1 μm inclusive, for example, but may alternatively be arranged to have any other desirable thickness.

In the case where the gold-containing layer is formed on the outer periphery of the core 40, a synthetic resin wire made of, for example, nylon or polyethylene may be used as the core 40. In this case, the gold-containing layer may be formed by electroless plating. In addition, the removal of the core 40 can be accomplished by, for example, immersing the core 40 in a strong alkaline solution or the like.

An example of the method for producing the Ni—P layer 10 has been described above. Although, in this example described above, the Ni—P layer 10 is produced by electroforming, the Ni—P layer 10 may alternatively be produced by a method other than electroforming, such as, for example, vacuum deposition, sputtering, or ion plating.

As described above, the contact probe according to an embodiment of the present disclosure is characterized in including the Ni—P layer, and in that the Ni—P layer has different concentrations of P at different positions in the thickness direction of the Ni—P layer. With the contact probe having the above structure, a portion of the Ni—P layer which has a relatively high concentration of P contributes to increased heat resistance and a reduced shrinkage of the spring portion, while a portion of the Ni—P layer which has a relatively low concentration of P contributes to increased toughness and improved strength of the spring portion, which in turn reduces the likelihood of a plastic deformation of the contact probe.

What is claimed is:

1. A contact probe comprising an Ni—P layer, wherein the Ni—P layer has different concentrations of P at different positions in a thickness direction of the Ni—P layer.

2. The contact probe according to claim 1, wherein the Ni—P layer includes a first portion and a second portion arranged in an order named from an inner side of the Ni—P layer in the thickness direction of the Ni—P layer; and
the second portion is arranged to have a concentration of P lower than that of the first portion.

3. The contact probe according to claim 2, wherein the Ni—P layer includes the first portion, the second portion, and a third portion arranged in an order named from the inner side of the Ni—P layer in the thickness direction of the Ni—P layer; and
the second portion is arranged to have a concentration of P lower than that of each of the first portion and the third portion.

4. The contact probe according to claim 3, wherein the Ni—P layer includes the first portion, the second portion, the third portion, a fourth portion, and a fifth portion arranged in an order named from the inner side of the Ni—P layer in the thickness direction of the Ni—P layer; and
each of the second portion and the fourth portion is arranged to have a concentration of P lower than that of each of the first portion, the third portion, and the fifth portion.

5. The contact probe according to claim 4, wherein an average concentration of P of the first portion is in a range of 1.0 mass % to 5.0 mass % inclusive.

6. The contact probe according to claim 4, wherein the second portion is spaced from an innermost surface of the Ni—P layer by ¼ or more of a thickness of the Ni—P layer; and
an average concentration of P of the second portion is in a range of 0.5 mass % to 5.0 mass % inclusive.

7. The contact probe according to claim 4, wherein, in the Ni—P layer, a highest concentration of P in the thickness direction is 1.2 or more times a lowest concentration of P in the thickness direction.

8. The contact probe according to claim 4, wherein an average concentration of P of a portion of the Ni—P layer which is spaced from an innermost surface of the Ni—P layer by ⅛ of a thickness of the Ni—P layer and which has a thickness of ⅛ of the thickness of the Ni—P layer is higher than an average concentration of P of a portion of the Ni—P layer which is spaced from the innermost surface of the Ni—P layer by ⅝ of the thickness of the Ni—P layer and which has a thickness of ⅛ of the thickness of the Ni—P layer.

9. The contact probe according to claim 4, further comprising
a layer having a composition different from the Ni—P layer and arranged outside of the Ni—P layer.

10. The contact probe according to claim 3, further comprising
a layer having a composition different from the Ni—P layer and arranged outside of the Ni—P layer.

11. The contact probe according to claim 2, wherein an average concentration of P of the first portion is in a range of 1.0 mass % to 5.0 mass % inclusive.

12. The contact probe according to claim 11, further comprising
a layer having a composition different from the Ni—P layer and arranged outside of the Ni—P layer.

13. The contact probe according to claim 2, wherein the second portion is spaced from an innermost surface of the Ni—P layer by ¼ or more of a thickness of the Ni—P layer; and
an average concentration of P of the second portion is in a range of 0.5 mass % to 5.0 mass % inclusive.

14. The contact probe according to claim 13, further comprising
a layer having a composition different from the Ni—P layer and arranged outside of the Ni—P layer.

15. The contact probe according to claim 2, further comprising
a layer having a composition different from the Ni—P layer and arranged outside of the Ni—P layer.

16. The contact probe according to claim 1, wherein, in the Ni—P layer, a highest concentration of P in the thickness direction is 1.2 or more times a lowest concentration of P in the thickness direction.

17. The contact probe according to claim 16, further comprising
a layer having a composition different from the Ni—P layer and arranged outside of the Ni—P layer.

18. The contact probe according to claim 1, wherein an average concentration of P of a portion of the Ni—P layer which is spaced from an innermost surface of the Ni—P layer by ⅛ of a thickness of the Ni—P layer and which has a thickness of ⅛ of the thickness of the Ni—P layer is higher than an average concentration of P of a portion of the Ni—P layer which is spaced from the innermost surface of the Ni—P layer by ⅝ of the thickness of the Ni—P layer and which has a thickness of ⅛ of the thickness of the Ni—P layer.

19. The contact probe according to claim 18, further comprising
a layer having a composition different from the Ni—P layer and arranged outside of the Ni—P layer.

20. The contact probe according to claim 1, further comprising
a layer having a composition different from the Ni—P layer and arranged outside of the Ni—P layer.

* * * * *